United States Patent [19]
Raabe et al.

[11] 3,840,306
[45] Oct. 8, 1974

[54] SEMICONDUCTOR CAPACITANCE DIODE HAVING ROUNDED OFF DOPING IMPURITY PROFILE

[76] Inventors: Gerhard Raabe, Wieserweg 5, 2 Willinghusen near Hamburg; Dieter Eckstein, Rugierweg 29A, 2 Hamburg 61; Heinz Sauermann, Flassheide 34, 2 Hamburg 54; Gerhard Winkler, Stuckweg 7, 2 Schenefeld, all of Germany

[22] Filed: May 23, 1973

[21] Appl. No.: 363,278

Related U.S. Application Data

[62] Division of Ser. No. 3,764,41, Oct. 9, 1973.

[30] Foreign Application Priority Data

Feb. 2, 1971 Germany ........................ 2104752

[52] U.S. Cl. ........................ 357/14, 357/89, 357/90
[51] Int. Cl. ........................ H01l 11/00, H01l 15/00
[58] Field of Search ......... 317/234, 9, 235, 48, 48.1

[56] References Cited

UNITED STATES PATENTS

| | | | |
|---|---|---|---|
| 3,201,664 | 8/1965 | Adam | 317/235 AM |
| 3,427,515 | 2/1969 | Blicher et al. | 317/234 UA |
| 3,558,375 | 1/1971 | Engeler | 317/235 AM |
| 3,611,058 | 10/1971 | Jordan | 317/234 UA |
| 3,634,738 | 1/1972 | Leith | 317/234 UA |
| 3,638,300 | 2/1972 | Foxhall et al. | 317/234 UA |
| 3,638,301 | 2/1972 | Matsuura | 317/235 AM |

*Primary Examiner*—Andrew J. James
*Attorney, Agent, or Firm*—Frank R. Trifari

[57] ABSTRACT

Semiconductor device including semiconductor capacitance diode, comprising a low resistivity substrate and a higher resistivity first layer, both of first conductivity type; a diffused surface region at the surface of the first layer or of a second layer located at the first layer, the diffused region having a conductivity level exceeding that of the surface; and a p,n junction within the surface portion of the foregoing structure, at least a part of the junction adjoining the diffused surface region. The first layer comprises an indiffused region, so that there is a rounded-off doping impurity profile.

11 Claims, 9 Drawing Figures

SEMICONDUCTOR CAPACITANCE DIODE HAVING ROUNDED OFF DOPING IMPURITY PROFILE

Figure 1:
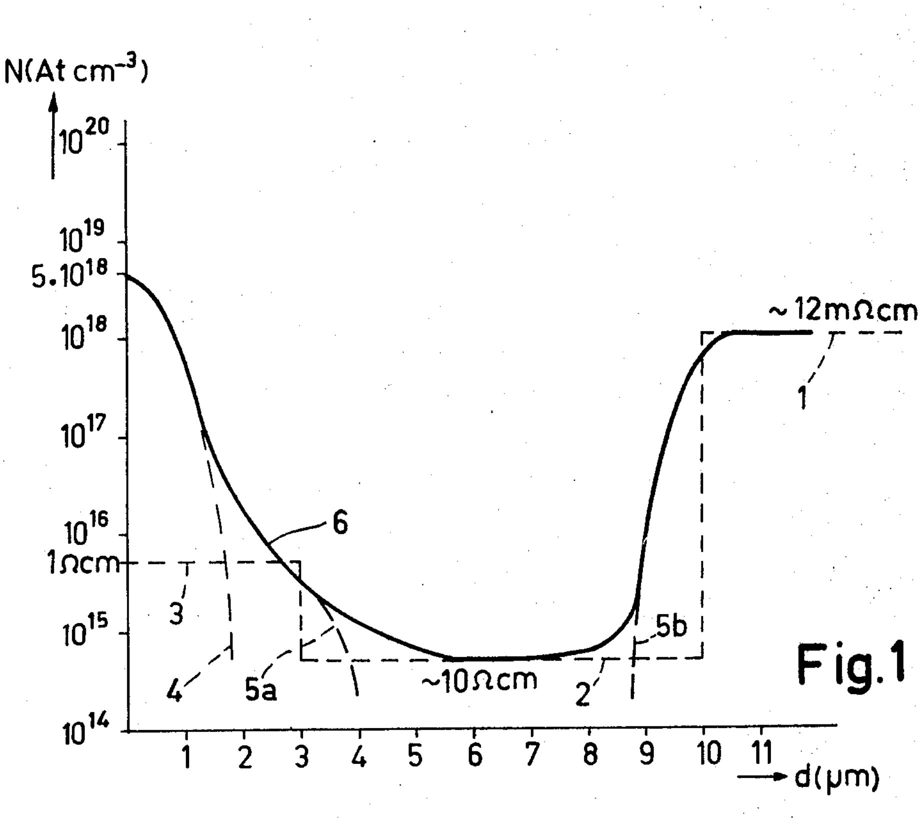

This is a division, of application Serial No. 222, 156, Jan. 31, 1972 now U.S. Pat. No. 3,764,415.

The invention relates to a method of manufacturing a semiconductor device having a semiconductor capacitance diode in which a layer of the first conductivity type is provided on a low-ohmic substrate of the first conductivity type, which layer has a higher resistivity than the substrate, after which a doping element determining the second conductivity type is diffused in the semiconductor surface to form a *p-n* junction.

A capacitance diode having a large capacity variation and an exponential variation of the capacity-voltage characteristic is to be understood to mean herein a diode which may be used in the tuning circuits of radio receivers with medium wave range and capacitively tuned receivers for similar wave ranges.

In addition to the requirement of a great difference in doping concentration of the semiconductor body and hence of a great capacitance variation, the requirement must be imposed upon such capacitance diodes that the capacitance-voltage characteristic has an exponential variation which is as accurate as possible.

In order to be able to manufacture capacitance diodes which meet said requirements reasonably, it is already known (see German Offenlegungschrift 2,614,775) to start from a semiconductor body of a first conductivity type on which a first and a second epitaxial layer of the first conductivity type are provided, the conductivity of the first epitaxial layer adjoining the semiconductor body being smaller than that of the second epitaxial layer, impurities from the second epitaxial layer being diffused in the first epitaxial layer, a zone of the second conductivity type being provided in the second epitaxial layer and forming the *p-n* junction of the capacitance diode.

Furthermore it is already known (see German Offenlegungsschrift 1,947,300) for manufacturing capacitance diodes having a very steep *p-n* junction, to provide on a low-ohmic substrate of a first conductivity type a higher ohmic layer of the first conductivity type and to epitaxially grow on said layer, by means of a passivating layer in which an aperture is etched, a highly doped further layer of the second conductivity type which contains in addition the first conductivity type determining doping elements. Upon heating the resulting semiconductor body, the first conductivity type determining doping elements diffuse from the epitaxially provided layer in the underlying semiconductor layer of the first conductivity type.

It has been found, however, that it is not possible with these known methods to manufacture a capacitance diode having such a large capacitance variation range and such a good capacitance-voltage characteristic that said diode can be used as a tuning diode in radio receivers having medium wave range.

One of the objects of the invention is to improve the prior art and, starting from a method of manufacturing a semiconductor capacitance diode in which a high-ohmic layer is first provided on a low-ohmic substrate, to provide an improved method which enables the manufacture of the capacitance diode which satisfies the above-mentioned requirements.

The invention is inter alia based on the recognition of the fact that it is possible to obtain the desirable doping profile by providing, if any, at least one lower ohmic layer (that is to say, no lower ohmic layer, one lower ohmic layer or several lower ohmic layers) on the high-ohmic layer of the starting body, by a thermal treatment rounding off the step-like doping profile and by at least one subsequent in-diffusion.

Therefore, in manufacturing a semiconductor device of the type mentioned in the preamble, the method is characterized in that at least a first layer of the first conductivity type is provided on the substrate, which layer has a higher resistivity than the substrate, that by a heat treatment the step-like doping profile resulting from the provided layers is rounded off by thermal diffusion, and that prior to providing the *p-n* junction in the last provided layer, at least one diffusion of a doping element determining the first conductivity type takes place as a result of which the conductivity of the layer provided last is furthermore increased.

The doping profile obtained by means of the method according to the invention may, for example, satisfy the relationship: $N(x) = A/x^2$ ($A$ = constant), with which a capacitance variation: $\ln C = K - k\ x\ U_R$ corresponds. This capacitance variation is one of the variations desired by the users of capacitance diodes.

In the two equations, the symbols have the following meanings:

- $N(x)$ = the impurity concentration at the area;
- $x$ = distance from the semiconductor surface to the *p-n* junction of the diode;
- $C$ = diode capacitance;
- $U_R$ = the cut-off voltage across the diode;
- $K$ = diode capacitance with $U_R = 0$ (= diffusion capacitance; and
- $k$ = proportionality factor.

A doping profile which results in the desirable properties of the capacitance diode can already be obtained when on the first high-ohmic layer one lower ohmic layer is provided in which a doping material is then diffused, or when no further layer is provided on the first layer but now at least two doping materials are indiffused having different diffusion rates and different concentrations.

As a result of the indiffusion, the impurity concentration in the last layer is preferably increased to $5\times10^{17} - 5\times10^{19}$ at/ccm.

Silicon which, for example, may be doped with antimony, is advantageously used as a semiconductor material, while the layers are advantageously grown on the substrate epitaxially and are doped, for example with phosphorus. Phorphorus is also preferably diffused in the last epitaxially grown layer. When two doping materials are to be indiffused, for example, arsenic or antimony may be used in addition to phosphorus.

The advantages resulting from the invention consist particularly in that capacitance diodes can be manufactured in a readily reproducible manner by means of a method which does not differ considerably from the standard methods of manufacturing semiconductor devices, of which diodes the capacitance variation range is so large and the variation of the capacitance-voltage characteristic is so closely exponential that they can be used in turning elements in radio receivers having medium wave range and in apparatus in which similar requirements are imposed upon the tuning elements.

Figure 1A:
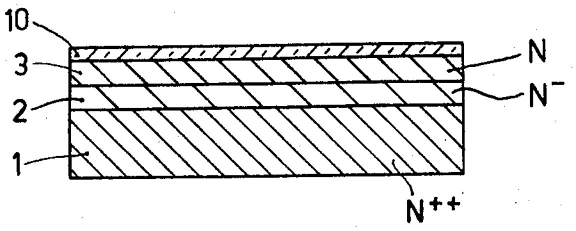
Figure 1B:
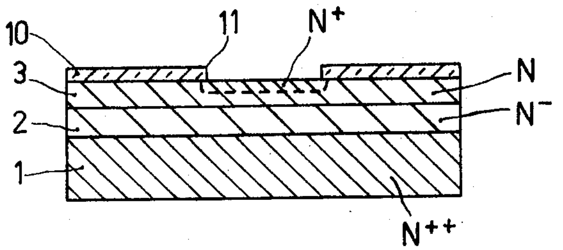
Figure 1C:
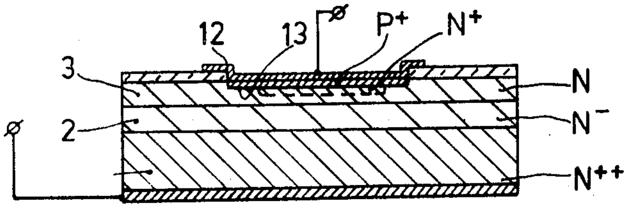

In order that the invention may be readily carried into effect, it will now be described in greater detail, by way of example, with reference to the accompanying drawings, in which:

FIG. 1 shows the doping profile of a capacitance diode manufactured according to a first embodiment of the method according to the invention (two-fold epitaxy and single diffusion), FIGS. 1*a* to 1*c* are diagrammatic cross-sectional views of a capacitance diode manufactured according to the embodiment shown in FIG. 1 during various stages of its manufacture.

Figure 2:
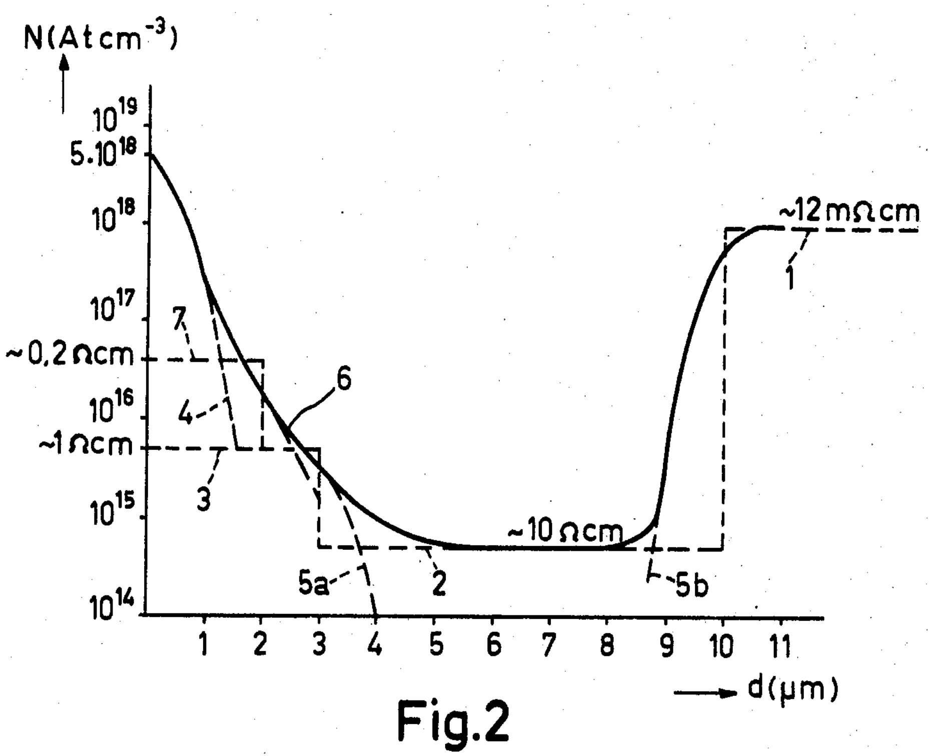
Figure 2A:
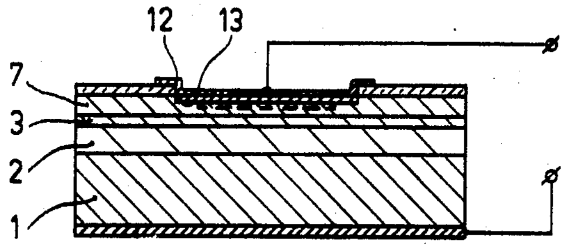
Figure 3:
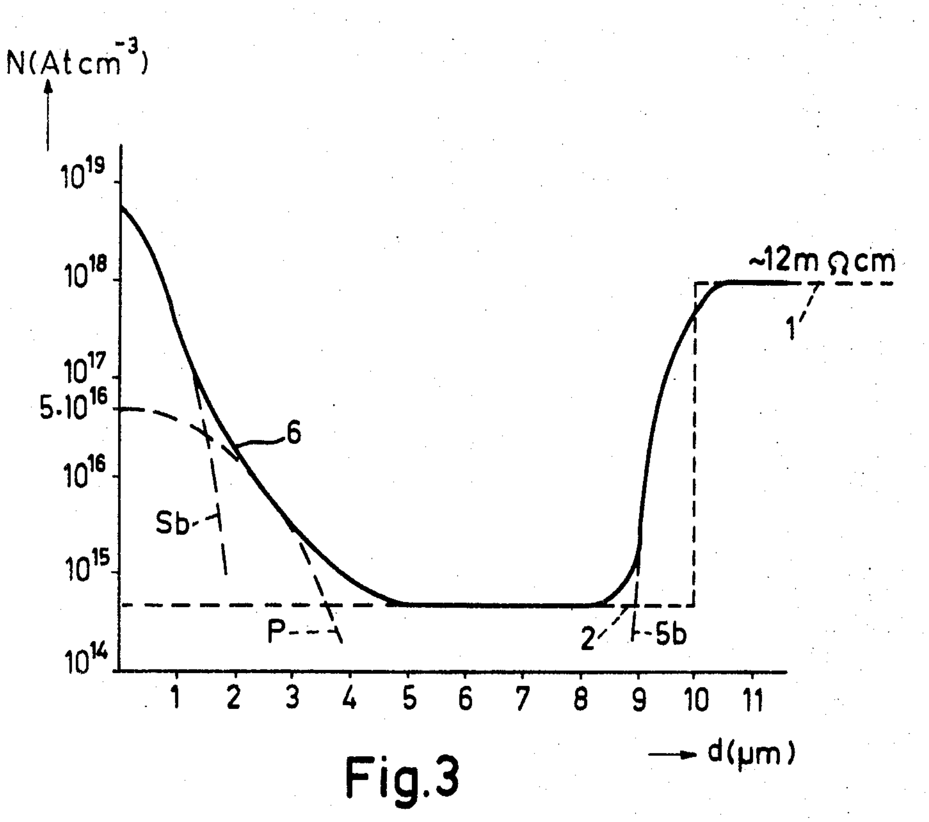
Figure 3A:
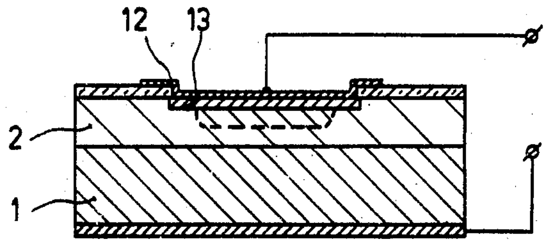
Figure 4:
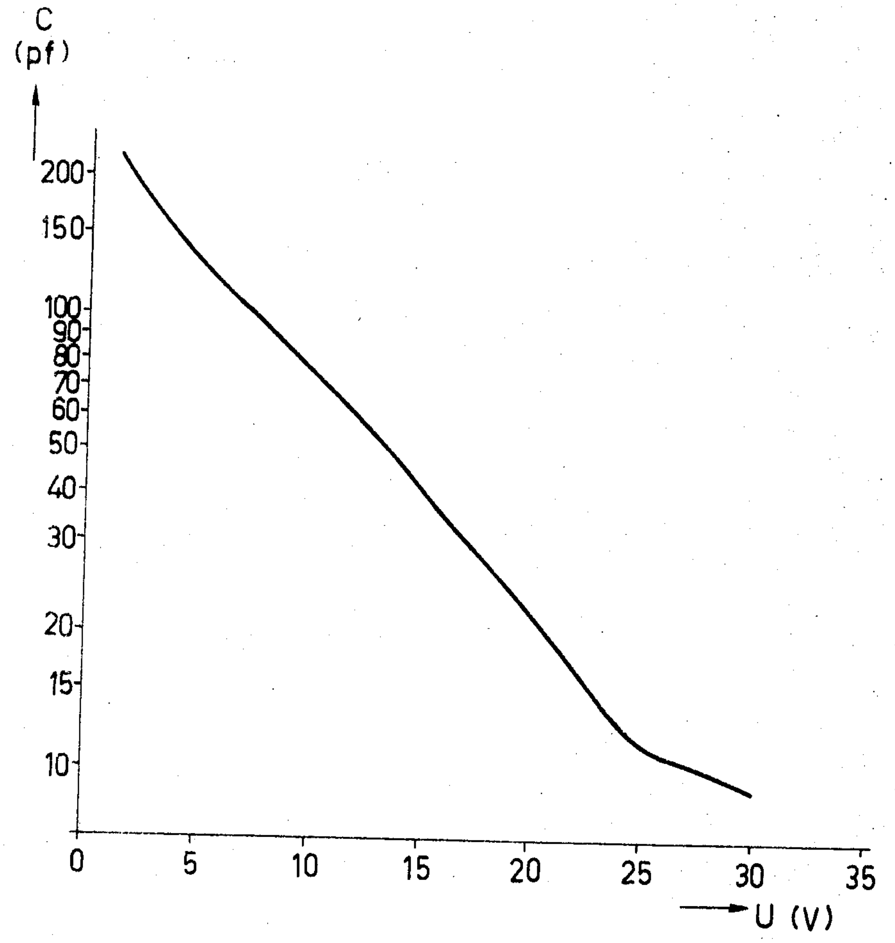

FIG. 2 shows the doping profile of a capacitance diode manufactured according to a second embodiment of the method according to the invention (three-fold epitaxy and single diffusion), FIG. 2*a* is a diagrammatic cross-sectional view of a capacitance diode manufactured according to the embodiment shown in FIG. 2, FIG. 3 shows the doping profile of the device having a capacitance diode manufactured according to a third embodiment of the method according to the invention (single epitaxy and simultaneously performed two-components diffusion), FIG. 3*a* is a diagrammatic cross-sectional view of a capacitance diode manufactured according to the embodiment shown in FIG. 3, and FIG. 4 shows the capacitance-voltage characteristic of a device having a capacitance diode with a doping profile according to FIG. 1 or FIG. 2.

FIG. 1 shows the doping profile of a capacitance diode manufactured according to a first embodiment of the method according to the invention. As shown in FIG. 1*a*, starting material is a silicon substrate 1, which is $n^{++}$ doped with antimony in such manner that a resistance of approximately 12 milliohm cm is obtained, A first high-ohmic epitaxial silicon layer 2, 9–12.5 $\mu$m thick, which is so strongly *n*-doped with phosphorus that a resistivity of 8–12 ohm.cm, preferably approximately 10 ohm.cm, is obtained, is then provided on said substrate by means of conventional methods. A second epitaxial silicon layer 3, 2.9–3.3 $\mu$m thick, which is also doped with phosphorus in such manner that a resistivity of 0.95 – 1.3 ohm.cm, preferably approximately 1 ohm.cm, is obtained, is then provided on said first epitaxial layer 2 preferably by means of the same method.

In FIG. 1, the doping concentration N in atoms/ccm is plotted over a distance *d* in $\mu$m taken from the silicon surface of the semiconductor body, The resistivity values associated with the relevant doping concentrations are recorded beside the corresponding sections of the profile. A thermal oxide 10 (see FIG. 1*a*) is provided on the second epitaxial layer 3. As a result of the thermal treatment required for said provision, a diffusion occurs simultaneously so that the initially step-like doping profile is rounded off.

As shown in FIG. 1*b*, a diffusion window 11 is then provided in the silicon oxide 10 and phosphorus is indiffused through said window with a surface concentration of preferably $5 \times 10^{18}$ at/ccm. The doping profile 4 obtained only as a result of said phosphorus diffusion is shown in broken lines in FIG. 1. During this diffusion and during the above-mentioned thermal treatment necessary for the oxidation, the phosphorus present in the second epitaxial layer 3 on the one hand and the antimony present on the substrate 1 on the other hand also diffuse in the first epitaxial layer 2 and provide, considered in itself, the respective doping profiles **5*a* and 5*b* likewise shown in broken lines in FIG. 1. The various mentioned doping profiles overlap each other and thus result in the final doping profile 6 (solid line in FIG. 1**).

After completion of the diffusion to obtain said doping profile, the surface of the semiconductor body is, for example, again oxidized after which in said oxide layer a further diffusion window 12 is provided which is larger than the window 11 for the indiffusion of the phosphorus and through which boron is then indiffused to a depth of approximately 0.9 $\mu$m (see FIG. 1c) to obtain the *p-n* junction 13.

After said second diffusion step, the actual capacitance diode is ready; the further treatment of the semiconductor body, namely the contacting, enveloping and so on, is then carried out according to known methods which are not described in detail here.

FIG. 2 shows the doping profile of a capacitance diode manufactured according to a second embodiment of the method according to the invention.

FIG. 2*a* is a cross-sectional view through the capacitance diode manufactured in this manner. This method corresponds substantially to that of the preceding embodiments; the only difference is that a third epitaxial layer 7 having a thickness of approximately 2 $\mu$m and a resistivity of approximately 0.2 ohm.cm. is provided on the second epitaxial layer 3.

FIG. 3 shows the doping profile and FIG. 3*a* is a cross-sectional view of a capacitance diode manufactured according to a third embodiment of the method according to the invention. The starting material in this method is a substrate 1 having only one epitaxially grown high-ohmic layer 2. The characteristic values (thickness and resistivity) of said layer correspond to those of the layer 2 of the first embodiment. A silicon oxide coating layer 12, approximately 0.25 $\mu$m thick, is provided on the high-ohmic epitaxial layer 2 by thermal oxidation. Windows for a two-fold $n^+$ diffusion to be carried out simultaneously are then provided in the silicon oxide layer. In this two-fold diffusion, phosphorus with a surface concentration of approximately $5 \times 10^{16}$ at/ccm and antimony with a surface concentration of approximately $5 \times 10^{18}$ atoms/ccm are simultaneously diffused. The corresponding depths of penetration are for phosphorus 2–2.5 $\mu$m and for antimony 1.3–1.6 $\mu$m. The doping profiles obtained separately as a result of the two diffusions are shown in broken lines in FIG. 3 and denoted by the abbreviations for the corresponding impurity materials (P and Sb). These two doping profiles overlap each other and thus result in the final doping profile 6. All further steps of manufacture correspond to those of the first embodiment.

FIG. 4 shows the capacitance variation in accordance with the applied voltage of a diode manufactured according to one of the above-described embodiments of the invention. This curve shows that with a voltage variation of 1–30 volt, a capacitance variation of approximately 10–250 pF can be achieved.

This capacitance variation and the variation of the capacitance in accordance with the voltage are such that a similar capacitance diode can be used in radio receivers with a medium wave range and in apparatus in which similar requirements are imposed upon the tuning elements.

It will be obvious that the invention is not restricted to the embodiments described but that many variations are possible to those skilled in the art without departing from the scope of this invention. For example, in particular more epitaxial layers can be provided and more diffusion may be used, while other semiconductor materials and insulating materials may also be used.

What is claimed is:

1. A semiconductor device including a semiconductor capacitance diode, comprising a. a substrate portion having a low resistivity and a first conductivity type;

b. a first layer of said first conductivity type disposed on and having a higher resistivity than said substrate portion;

c. at least a first further layer disposed at said first layer, said further layer having said first conductivity type and a lower resistivity than said first layer, said substrate, first layer and further layer comprising a semiconductor body comprising a surface portion of a given conductivity level;

d. a diffused surface region at at least said surface portion, said diffused surface region having a conductivity level exceeding the given conductivity level of said surface portion and said first layer comprising indiffused regions containing first conductivity type doping material diffused therein from said substrate and said second further layer, respectively, whereby said semiconductor body is characterized by a rounded off doping impurity profile; and e. a *p*, *n* junction located within said surface portion and defined by a second conductivity type zone and said surface portion, at least a part of said junction adjoining said diffused surface region.

2. A semiconductor device as defined in claim 1, wherein said semiconductor body comprises at least two further layers disposed one upon another, each of said further layers having a lower resistivity value than its immediately underlying said further layer and the further layer located at the surface of said body comprising said surface region.

3. A semiconductor device including a semiconductor capacitance diode, comprising a. a substrate portion having a low resistivity and a first conductivity type;

b. a first layer of said first conductivity type disposed on and having a higher resistivity than said substrate portion, said substrate and said first layer comprising a semiconductor body comprising a surface portion of a given conductivity level;

c. a first conductivity type diffused surface region at at least said surface portion, said diffused surface region having a conductivity level exceeding the conductivity level of said surface portion and said first layer comprising indiffused regions containing first conductivity type doping material diffused therein from at least said substrate, whereby said semiconductor body is characterized by a rounded off doping impurity profile; and d. a *p,n* junction located within said surface portion and defined by a second conductivity type zone and said surface region, at least a part of said junction adjoining said diffused surface region.

4. A semiconductor device as in claim 1, wherein said diffused surface region extends along the exposed surface of said surface region to a lesser extent than said *p,n* junction.

5. A semiconductor device as in claim 1, wherein said diffused surface region extends to a greater depth from said surface portion than said *p,n* junction.

6. A semiconductor device as in claim 1, wherein said further layer is characterized by a conductivity level below that of said substrate portion.

7. A semiconductor device as in claim 1, wherein said diffused surface region comprises a doping impurity concentration exceeding that of said substrate portion.

8. A semiconductor device as in claim 4, wherein said diffused surface region extends along the exposed surface of said surface region to a lesser extent than said *p,n* junction.

9. A semiconductor device as in claim 3, wherein said diffused surface region extends to a greater depth from said surface portion than said *p,n* junction.

10. A semiconductor device as in claim 3, wherein said diffused surface region comprises a doping impurity concentration exceeding that of said substrate portion.

11. A semiconductor device as in claim 3, wherein said diffused surface region comprises first and second first conductivity type doping impurities, said first impurity being characterized by a greater diffusion rate than said second impurity.

* * * * *

PO-1050
(5/69)

UNITED STATES PATENT OFFICE
CERTIFICATE OF CORRECTION

Patent No. 3,840,306 Dated October 8, 1974

Inventor(s) GERHARD RAABE ET AL

It is certified that error appears in the above-identified patent and that said Letters Patent are hereby corrected as shown below:

On the title page make the following changes:

Add Section

--[73] Assignee: U. S. Philips Corporation
New York, N.Y.--;

Section [62] change "Ser. No. 3,764,41" to

--Patent No. 3,764,415--;

Section [30] change "2104752" to --P.2104752.9--.

Column 1, line 31, change "2,614,775" to --1,614,775--.

Column 2, line 66, change "turning" to --tuning--.

Signed and sealed this 28th day of January 1975.

;EAL)
:test:

;COY M. GIBSON JR.
:testing Officer

C. MARSHALL DANN
Commissioner of Patents